United States Patent
Morisawa et al.

(10) Patent No.: US 10,715,093 B2
(45) Date of Patent: Jul. 14, 2020

(54) POWER AMPLIFIER MODULE

(71) Applicant: Murata Manufacturing Co., Ltd., Kyoto (JP)

(72) Inventors: Fuminori Morisawa, Kyoto (JP); Kenji Mukai, Kyoto (JP); Yuri Honda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/284,002

(22) Filed: Feb. 25, 2019

(65) Prior Publication Data

US 2019/0280658 A1 Sep. 12, 2019

(30) Foreign Application Priority Data

Mar. 9, 2018 (JP) .................................. 2018-042878
Jan. 11, 2019 (JP) .................................. 2019-003806

(51) Int. Cl.
| | |
|---|---|
| *H03F 1/30* | (2006.01) |
| *H03F 3/24* | (2006.01) |
| *H03F 1/52* | (2006.01) |
| *H03F 3/193* | (2006.01) |

(52) U.S. Cl.
CPC ............. *H03F 3/245* (2013.01); *H03F 1/523* (2013.01); *H03F 3/193* (2013.01)

(58) Field of Classification Search
CPC ........................................................ H03F 1/30
USPC ................................................. 330/296, 285
See application file for complete search history.

(56) References Cited

U.S. PATENT DOCUMENTS

| | | | | |
|---|---|---|---|---|
| 8,692,619 B2* | 4/2014 | Wakita | .................. | H03F 1/0261 330/289 |
| 9,531,186 B2* | 12/2016 | Yagyu | ..................... | H02H 9/02 |
| 2013/0033327 A1 | 2/2013 | Kadoi et al. | | |
| 2014/0139292 A1* | 5/2014 | Ripley | .................. | H03F 1/0261 330/294 |
| 2014/0334051 A1* | 11/2014 | Yagyu | ..................... | H02H 9/02 361/93.1 |
| 2015/0070092 A1 | 3/2015 | Ishimoto et al. | | |
| 2015/0130537 A1* | 5/2015 | Nakamura | ............ | H03F 1/0261 330/254 |

(Continued)

FOREIGN PATENT DOCUMENTS

| | | |
|---|---|---|
| JP | 2013-38531 A | 2/2013 |
| JP | 217-22685 A | 1/2017 |
| WO | 2015/002294 A1 | 1/2015 |

*Primary Examiner* — Henry Choe
(74) *Attorney, Agent, or Firm* — Pearne & Gordon LLP

(57) ABSTRACT

A power amplifier module includes a first transistor that amplifies and outputs a radio frequency signal, a second transistor smaller in size than the first transistor and connected in parallel with the first transistor, a third transistor that supplies a bias current to the first and second transistors, a current detection circuit that detects a current flowing through a collector of the second transistor, and a bias control circuit that controls the bias current supplied from the third transistor to the first and second transistors by supplying a current corresponding to a detection result of the current detection circuit to a collector or a drain of the third transistor. In a case that a current flowing through the collector of the second transistor is larger than a predetermined threshold value, the bias control circuit reduces the current supplied to the collector or the drain of the third transistor.

19 Claims, 11 Drawing Sheets

(56) References Cited

U.S. PATENT DOCUMENTS

2018/0294788 A1  10/2018  Ishihara et al.

* cited by examiner

POWER AMPLIFIER MODULE

This application claims priority from Japanese Patent Application No. 2018-042878 filed on Mar. 9, 2018, and claims priority from Japanese Patent Application No. 2019-003806 filed on Jan. 11, 2019. The content of these applications are incorporated herein by reference in their entireties.

BACKGROUND OF DISCLOSURE

1. Field of the Disclosure

The present disclosure relates to a power amplifier module.

2. Description of the Related Art

In mobile communication equipment such as a cellular phone, a transmission unit for transmitting a radio frequency (RF) signal to a base station is mounted. A power amplifier circuit for amplifying power of an RF signal to be transmitted to the base station is used in the transmission unit. In such transmission unit, a large current may flow in the power amplifier circuit when, for example, an impedance of a load such as an antenna or the like changes. Therefore, in order to prevent the power amplifier circuit from being broken due to the large current, the current flowing through the power amplifier circuit is limited in the transmission unit.

For example, International Publication No. WO 2015/002294 discloses a power amplifier module including a first amplification transistor for amplifying and outputting a radio frequency signal, a second amplification transistor connected in parallel with the first amplification transistor, a bias circuit for supplying a bias voltage to the first and second transistors, a current detection circuit for detecting a current flowing through the second amplification transistor, and a bias control circuit for controlling a bias voltage supplied from the bias circuit to the first and second amplification transistors in accordance with a detection result of the current detection circuit.

However, when the bias of the first and second amplification transistors is controlled by voltage, as in the power amplifier module disclosed in International Publication No. WO 2015/002294, if the input power increases, the current flowing in the power amplifier circuit may become excessively large due to a self-bias effect.

BRIEF SUMMARY OF THE DISCLOSURE

The present disclosure has been made in view of such circumstances, and it is an object of the present disclosure to suppress a current flowing through a power amplifier circuit when an input power is equal to or larger than a predetermined threshold value.

A power amplifier module according to an aspect of the present disclosure includes a first transistor that amplifies and outputs a radio frequency signal, a second transistor smaller in size than the first transistor and connected in parallel with the first transistor, a third transistor that supplies a bias current to the first and second transistors, a current detection circuit that detects a current flowing through a collector of the second transistor, and a bias control circuit that controls the bias current supplied from the third transistor to the first and the second transistors by supplying a current corresponding to a detection result of the current detection circuit to a collector or a drain of the third transistor, in which in a case that the current flowing through the collector of the second transistor is larger than a predetermined threshold value, the bias control circuit reduces the current supplied to the collector or the drain of the third transistor.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 4C is a schematic diagram illustrating an example of a relationship between input power Pin and a detection voltage Vsense of the power amplifier module according to the second embodiment;

DETAILED DESCRIPTION OF THE DISCLOSURE

Figure 1:
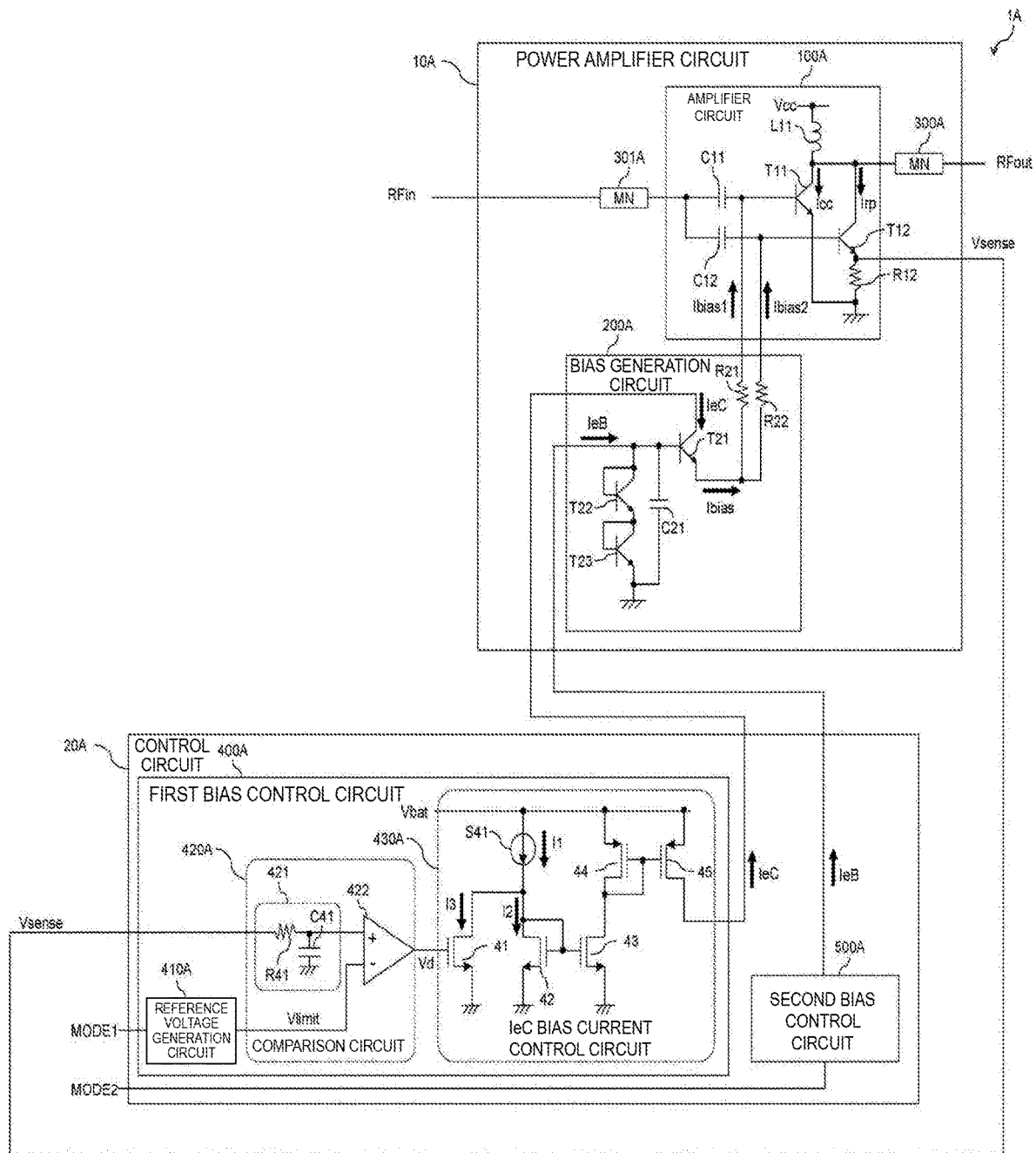
FIG. 1 is a diagram illustrating an example of a configuration of a power amplifier module according to a first embodiment of the present disclosure.

With reference to the accompanying drawings, preferred embodiments of the present disclosure will be described.

Note that in each of the drawings, the same reference numerals denote the same or similar components.

First Embodiment

1. Configuration of Power Amplifier Module 1A
1-1. Power Amplifier Module 1A

FIG. 1 is a diagram illustrating an example of a configuration of a power amplifier module 1A according to a first embodiment of the present disclosure. The power amplifier module 1A amplifies a radio frequency (RF) signal RFin and outputs an amplified signal RFout.

As illustrated in FIG. 1, the power amplifier module 1A includes a power amplifier circuit 10A and a control circuit 20A. The power amplifier circuit 10A and the control circuit 20A are formed on different substrates, for example. For example, the power amplifier circuit 10A may be configured using a bipolar transistor such as a heterojunction bipolar transistor (HBT). When an HBT is used for the power amplifier circuit 10A, for example, SiGe, GaAs, InP, GaN, or the like may be used as a material of a substrate constituting the HBT. Further, the control circuit 20A may be configured using, for example, a metal-oxide-silicon field-effect transistor (MOSFET). Note that the power amplifier circuit 10A and the control circuit 20A may be formed on the same substrate.

1-2. Power Amplifier Circuit 10A

The power amplifier circuit 10A amplifies the power of the RF signal (RFin) inputted to the power amplifier circuit 10A, and outputs an amplified signal (RFout). The power amplifier circuit 10A includes an amplifier circuit 100A, a bias generation circuit 200A and matching circuits 300A and 301A.

1-2-1. Amplifier Circuit 100A

The amplifier circuit 100A includes an inductor L11, a transistor T11 (first transistor), a capacitor C11, a transistor T12 (second transistor), a capacitor C12, and a resistor element R12.

The inductor L11 is a choke inductor that suppresses the leakage of an RF signal (RFin) to the power supply side. A power supply voltage Vcc is supplied to a first terminal of the inductor L11. A second terminal of the inductor L11 is connected to a collector of the transistor T11 and a collector of the transistor T12.

The transistor T11 (first transistor) is a current amplification element (amplification transistor) that amplifies a current inputted to a base and outputs the amplified current. The collector of the transistor T11 is connected to the second terminal of the inductor L11. The base of the transistor T11 is connected to each of a second terminal of the capacitor C11 and a second terminal of a resistor element R21. An emitter of the transistor T11 is grounded. A portion of the RF signal (RFin) is inputted to the base of the transistor T11 through the matching circuit 301A and the capacitor C11. Further, a bias current 'bias' generated by the bias generation circuit 200A is supplied to the base of the transistor T11 through the resistor element R21. Further, the power supply voltage Vcc is supplied to the collector of the transistor T11 through the inductor L11.

The capacitor C11 is a coupling capacitor for removing a voltage of a DC component of the RF signal (RFin). A first terminal of the capacitor C11 is connected to a matching circuit 301A, and the second terminal of the capacitor C11 is connected to the base of the transistor T11.

The transistor T12 (second transistor) is a transistor smaller in size than the transistor T11, and is a current amplification element (amplification transistor) for amplifying a current inputted to the base and outputting the amplified current in the same way as in the configuration of the transistor T11. Here, for example, the size of the transistor may be determined as an area of an emitter in a plan view. As will be described later, the transistor T12 has a function as a replica transistor for detecting a collector current Icc of the transistor T11. The collector of the transistor T12 is connected to the second terminal of the inductor L11. A base of the transistor T12 is connected to a second terminal of the capacitor C12 and to a second terminal of a resistor element R22. An emitter of the transistor T12 is connected to a first terminal of the resistor element R12. A portion of the RF signal (RFin) is inputted to the base of the transistor T12 through the matching circuit 301A and the capacitor C12. Further, a bias current Ibias2 generated by the bias generation circuit 200A is supplied to the base of the transistor T12 through the resistor element R22. Further, the power supply voltage Vcc is supplied to the collector of the transistor T12 through the inductor L11.

The capacitor C12 is a coupling capacitor for removing a voltage of a DC component of the RF signal (RFin). A first terminal of the capacitor C12 is connected to the matching circuit 301A, and the second terminal of the capacitor C12 is connected to the base of the transistor T12.

The resistor element R12 constitutes a current detection circuit for detecting a collector current Irp of the transistor T12, and generates a detection voltage Vsense corresponding to the collector current Irp of the transistor T12. The first terminal of the resistor element R12 is connected to the emitter of the transistor T12, and a second terminal of the resistor element R12 is grounded. Further, the collector current Irp of the transistor T12 is determined based on the size ratio of the transistor T11 to the transistor T12.

1-2-2. Bias Generation Circuit 200A

The bias generation circuit 200A includes the resistance elements R21 and R22, transistors T21 (third transistor), T22 and T23, and a capacitor C21.

A first terminal of the resistor element R21 is connected to an emitter of the transistor T21, and the second terminal of the resistor element R21 is connected to the second terminal of the capacitor C11 and the base of the transistor T11.

A first terminal of the resistor element R22 is connected to the emitter of the transistor T21, and the second terminal of the resistor element R22 is connected to the second terminal of the capacitor C12 and the base of the transistor T12.

The transistor T21 (third transistor) is a current amplification element (amplification transistor) which supplies a base current to the power amplifier transistor T11 and T12 of the amplifier circuit 100A. A collector of the transistor T21 is connected to a first bias control circuit 400A, which will be described later, and a collector current IeC is supplied from the first bias control circuit 400A. A base of the transistor T21 is connected to a second bias control circuit 500A, which will be described later, and a base current IeB is supplied from the second bias control circuit 500A. The emitter of the transistor T21 is connected to the first terminal of the resistor element R21 and the first terminal of the resistor element R22. A bias current Ibias is supplied to the amplifier circuit 100A from the emitter of the transistor T21 in accordance with the control by each of the first bias control circuit 400A and the second bias control circuit 500A. A portion of the bias current Ibias flows, as the bias current Ibias1, into the base of the transistor T11 through the resistor element R21. A portion of the bias current Ibias flows, as the bias current Ibias2, into the base of the transistor T12 through the resistor element R22. Note that the transistor T21 (third transistor) that supplies the base current to the power amplifier transistor T11 and T12 of the amplifier circuit 100A may be configured using a FET. Specifically, a gate of the FET (third transistor) corresponds to the base of the transistor T21, a drain of the FET corresponds to the collector of the transistor T21, and a source of the FET corresponds to the emitter of the transistor T21, respectively.

Transistors T22 and T23 and the capacitor C21 are configured so that the voltage of the base of the transistor T21 is set at a predetermined level. Each of the transistors T22 and T23 is diode-connected. An emitter of the transistor T22 is connected to a collector of the transistor T23. An emitter of the transistor T23 is grounded. A first terminal of the capacitor C21 is connected to the base of the transistor T21 and to a collector of the transistor T22, and a second terminal of the capacitor C21 is grounded.

1-2-3. Principle of Detecting Collector Current Icc

Here, a principle of detecting the collector current Icc of the transistor T11 by the transistor T12 (replica transistor) will be described.

The ratio of the size of the transistor T11 to the size of the transistor T12 is set to N:1. Here, N is assumed to be a real number sufficiently larger than 1 so that the collector current Icc of the transistor T11 becomes sufficiently larger than the collector current Irp of the transistor T12. Specifically, for example, in the case where the transistor T11 and the transistor T12 have a multi-emitter structure, the ratio of the number of unit transistors (fingers) included in the transistor T11 to the number of unit transistors included in the transistor T12 may be set to N:1. Alternatively, for example, in a case that the transistor T11 and the transistor T12 have a single emitter structure, the ratio of the size (emitter size) of the transistor T11 to the size (emitter size) of the transistor T12 may be set to N:1.

At this time, the ratio of the collector current Icc of the transistor T11 to the collector current Irp of the transistor T12 is substantially equal to the ratio of the sizes of the transistors T11 to T12 (N:1). In other words, current densities of the transistors T11 and T12 become substantially equal.

Thus, by detecting the collector current Irp of the transistor T12, it becomes possible to detect the collector current Icc of the transistor T11. In this embodiment, by converting the collector current Irp of the transistor T12 into the detection voltage Vsense by the resistor element R12, the collector current Icc can be detected.

Note that, for example, the capacitance of the capacitors C11 and C12 and the resistance values of the resistor elements R21 and R22 may be set so that the ratio of the collector current Icc to the collector current Irp is made closer to the ratio of the size of the transistor T11 to the size of transistor T12 (N:1). Thus, the accuracy of the detection of the collector current Icc is improved.

Further, a resistor element may be provided on the emitter side of the transistor T11. By providing the resistor element, the characteristics of the transistor T12 are made closer to those of the transistor T11, and the ratio of the collector current Icc to the collector current Irp becomes closer to the ratio of the size of the transistor T11 to the size of the transistor T12 (N:1). Thus, the accuracy of the detection of the collector current Icc is improved.

1-3. Control Circuit 20A

The control circuit 20A controls the bias generation circuit 200A included in the power amplifier circuit 10A. The control circuit 20A includes the first bias control circuit 400A and the second bias control circuit 500A. Control signals MODE1 and MODE2 are supplied to the first bias control circuit 400A and the second bias control circuit 500A, respectively. Here, the control signals MODE1 and MODE2 are appropriate signals related to the control of the power amplifier module 1A, a transmission unit including the power amplifier module 1A, or the like. For example, the control signals MODE1 and MODE2 may be control signals for switching between power modes (for example, high power mode and low power mode) of the power amplifier module 1A. Further, for example, the control signals MODE1 and MODE2 may be control signals for switching between frequency bands of the RF signals. In addition, the control signal MODE1 may be a control signal for generating an appropriate limit current value.

The first bias control circuit 400A includes a reference voltage generation circuit 410A, a comparison circuit 420A and an IeC bias current control circuit 430A.

The reference voltage generation circuit 410A is supplied with the control signal MODE'. The reference voltage generation circuit 410A generates a reference voltage Vlimit corresponding to the control signal MODE1, and supplies the reference voltage Vlimit to an inverting input terminal of a differential amplifier 422 included in the comparison circuit 420A.

The comparison circuit 420A includes a low pass filter 421 and the differential amplifier 422. The low pass filter 421 includes a resistor element R41 and a capacitor C41. A first terminal of the resistor element R41 is connected to the first terminal of the resistor element R12 included in the amplifier circuit 100A described above. A second terminal of the resistor element R41 is connected to a first terminal of the capacitor C41 and a non-inverting input terminal of the differential amplifier 422. A second terminal of the capacitor C41 is grounded. The non-inverting input terminal of the differential amplifier 422 is supplied, through the resistor element R41, with a detection voltage Vsense that is generated by the resistor element R12 of the amplifier circuit 100A. The reference voltage Vlimit is supplied from the reference voltage generation circuit 410A to the inverting input terminal of the differential amplifier 422. An output terminal of the differential amplifier 422 is connected to the IeC bias current control circuit 430A, and outputs a voltage difference signal Vd based on a difference between the detection voltage Vsense and the reference voltage Vlimit (the voltage signal obtained by amplifying a difference between the detection voltage Vsense and the reference voltage Vlimit at a predetermined ratio) to the IeC bias current control circuit 430A.

The IeC bias current control circuit 430A supplies the collector current IeC to the collector of the transistor T21 included in the bias generation circuit 200A based on the voltage difference signal Vd outputted from the comparison circuit 420A described above. In particular, as will be described later, the IeC bias current control circuit 430A reduces, based on the voltage difference signal Vd, the collector current IeC in a case that the detection voltage Vsense is larger than the reference voltage Vlimit. In a case that the transistor T21 is constituted by a FET, the IeC bias current control circuit 430A supplies a drain current to the FET on the basis of the voltage difference signal Vd outputted from the comparison circuit 420A described above.

The IeC bias current control circuit 430A includes a constant current source S41, N-channel MOSFETs 41, 42 and 43, and P-channel MOSFETs 44 and 45. The N-channel MOSFET 41 constitutes an extraction circuit for extracting, from a current I1 supplied from the constant current source S41, a current I3 corresponding to the voltage difference signal Vd outputted from the differential amplifier 422. The N-channel MOSFETs 42 and 43 and the P-channel MOSFETs 44 and 45 have a current mirror configuration, and constitute a current supply circuit that supplies, to the collector of the transistor T21, the collector current IeC equal to a remaining current I2 (=I1−I3) obtained by subtracting the current I3 extracted by the N-channel MOSFET (extraction circuit) from the current I1 supplied from the constant current source S41. Note that the IeC bias current control circuit 430A may be configured by a bipolar transistor instead of the MOSFETs 41, 42, 43, 44, and 45.

A power supply voltage Vbat is supplied to a first terminal of the constant current source S41, and a second terminal of the constant current source S41 is connected to a drain of the N-channel MOSFET 41 and a drain of the N-channel MOSFET 42. A gate of the N-channel MOSFET 41 is connected to the output terminal of the differential amplifier 422, and a signal (voltage difference signal Vd) indicating a comparison result of the detection voltage Vsense and the reference voltage Vlimit described above is supplied from the differential amplifier 422. A source of the N-channel MOSFET 41 is grounded. The N-channel MOSFET 42 is diode-connected. The drain of the N-channel MOSFET 42 is connected to the second terminal of the constant current source S41, and the current I2 is supplied from the constant current source S41. A source of the N-channel MOSFET 42 is grounded. The N-channel MOSFET 43 is connected in current mirror connection with the N-channel MOSFET 42. A drain of the N-channel MOSFET 43 is connected to a drain of the P-channel MOSFET 44, and a source of the N-channel MOSFET 43 is grounded. The P-channel MOSFET 44 is diode-connected. A source of the P-channel MOSFET 44 is supplied with the power supply voltage Vbat. The P-channel MOSFET 45 is connected in current mirror connection with the P-channel MOSFET 44. A source of the P-channel MOSFET 45 is supplied with the power supply voltage Vbat. A drain of the P-channel MOSFET 45 is connected to the collector of the transistor T21 described above, and the P-channel MOSFET 45 supplies the collector current IeC to the collector of the transistor T21.

The second bias control circuit 500A is connected to the base of the transistor T21 of the bias generation circuit 200A described above. The control signal MODE2 is inputted to the second bias control circuit 500A. The second bias control circuit 500A supplies the base current IeB corresponding to the control signal MODE2 to the base of the transistor T21 and the diode-connected transistors T22 and T23.

2. Operation of Power Amplifier Module 1A

Figure 2A:
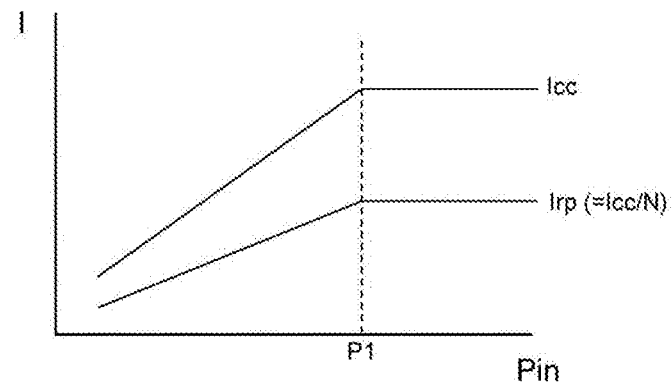
FIG. 2A is a schematic diagram illustrating an example of relationships between input power Pin and a collector current Icc and between input power Pin and a collector current Irp of the power amplifier module according to the first embodiment.
Figure 2B:
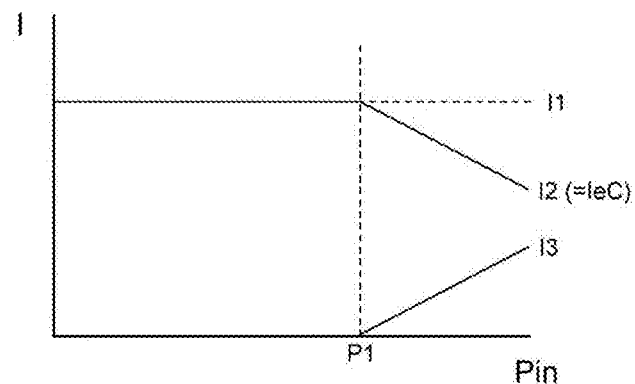
FIG. 2B is a schematic diagram illustrating an example of relationships between input power Pin and a current I1, between input power Pin and a current I2, and between input power Pin and a current I3 of the power amplifier module according to the first embodiment.
Figure 2C:
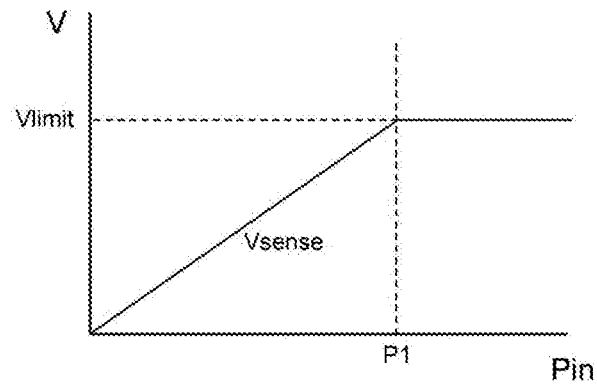
FIG. 2C is a schematic diagram illustrating an example of a relationship between input power Pin and a detection voltage Vsense of the power amplifier module according to the first embodiment.

Referring to FIG. 2A to FIG. 2C, the operations of the power amplifier module 1A will be described.

FIG. 2A is a schematic diagram illustrating an example of relationships between the input power Pin which is power of the RF signal (RFin) and the collector current Icc of the transistor T11 and between the input power Pin and the collector current Irp of the transistor T12. In FIG. 2A, a horizontal axis represents the input power Pin and the vertical axis represents a current value.

FIG. 2B is a diagram illustrating an example of relationships between the input power Pin and the current I1 of the constant current source S41, between the input power Pin and the current I2 that flows through the N-channel MOSFET 42, and between the input power Pin and the current I3 that flows through the N-channel MOSFET 41. In FIG. 2B, a horizontal axis represents the input power Pin, and a vertical axis represents a current value.

FIG. 2C is a schematic diagram illustrating an example of a relationship between the input power Pin which is power of the RF signal (RFin) and the detection voltage Vsense. In FIG. 2C, a horizontal axis represents the input power Pin, and a vertical axis represents a voltage value.

In a case that the input power Pin is smaller than a predetermined power value P1, since the output signal of the differential amplifier 422 is a negative voltage, the N-channel MOSFET41 is OFF. Therefore, as illustrated in FIG. 2B, the current I1 of the constant current source S41 does not flow into the N-channel MOSFET41, but flows into the N-channel MOSFET42 entirely. That is, I1=I2. Then, by the current mirror connection of the N-channel MOSFETs 42 and 43 and the current mirror connection of the P-channel MOSFETs 44 and 45, a constant collector current IeC equal to the current I2 flows out of the P-channel MOSFET 45. Then, the collector current IeC is supplied to the collector of the transistor T21. At this time, as illustrated in FIG. 2A, as the input power Pin increases, both the collector current Icc and the collector current Irp increase. Further, as illustrated in FIG. 2C, as the collector current Irp increases, the detection voltage Vsense increases.

When the input power Pin rises to the predetermined value P1, as illustrated in FIG. 2C, the detection voltage Vsense becomes equal to the reference voltage Vlimit, and the output signal of the differential amplifier 422 switches from a negative voltage to a positive voltage (a voltage equal to or higher than a threshold voltage of the N-channel MOSFET 41). Thus, the N-channel MOSFET 41 is turned on, and the N-channel MOSFET 41 starts to extract the current I3 from the current I1 of the constant current source S41.

Further, as the input power Pin increases, as illustrated in FIG. 2B, the current I3 that the N-channel MOSFET 41 extracts from the constant current source S41 increases, and the current (=I1−I3) that flows into the N-channel MOSFET 42 decreases. Accordingly, the collector current IeC supplied from the P-channel MOSFET 45 to the transistor T21 also decreases. Then, both the bias current 'bias' supplied from the transistor T21 to the transistor T11 and the bias current Ibias2 supplied from the transistor T21 to the transistor T12 decrease. Therefore, as illustrated in FIG. 2A, even if the input power Pin rises, increases in the collector current Icc of the transistor T11 and the collector current Irp of the transistor T12 are suppressed (clamped). Then, as illustrated in FIG. 2C, an increase in the detection voltage Vsense is also suppressed (clamped). As described above, when the input power Pin becomes equal to or larger than the predetermined value, an increase in the collector current Icc of the transistor T11 is suppressed.

Second Embodiment

1. Configuration of Power Amplifier Module 1B

Figure 3:
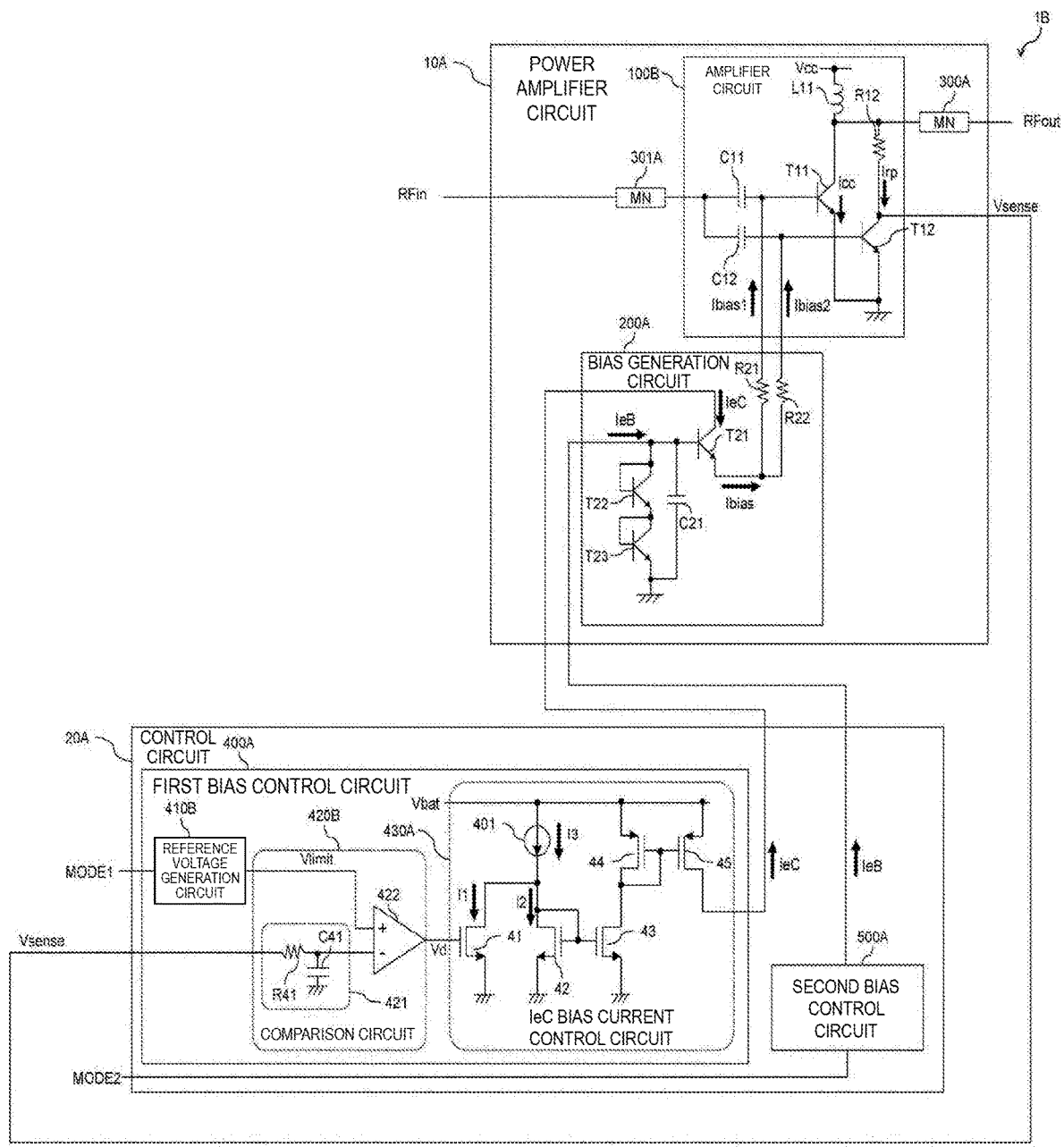
FIG. 3 is a diagram illustrating an example of a configuration of a power amplifier module according to a second embodiment of the present disclosure.

FIG. 3 is a diagram illustrating an example of a configuration of a power amplifier module 1B according to a second embodiment of the present disclosure. In the configuration of the power amplifier module 1B, the descriptions of the same configuration as that of the power amplifier module 1A will be omitted as appropriate.

As illustrated in FIG. 3, the power amplifier module 1B includes an amplifier circuit 100B in place of the amplifier circuit 100A. In addition, the power amplifier module 1B includes a comparison circuit 420B instead of the comparison circuit 420A. Moreover, the power amplifier module 1B includes a reference voltage generation circuit 410B instead of the reference voltage generation circuit 410A.

In the amplifier circuit 100B, the resistor element R12 is connected to the collector side of the transistor T12. In other words, the first terminal of the resistor element R12 is connected to the second terminal of the inductor L11, and the second terminal of the resistor element R12 is connected to the collector of the transistor T12.

The resistor element R12 constitutes the current detection circuit for detecting the collector current Irp of the transistor T12, and generates the detection voltage Vsense corresponding to the collector current Irp of the transistor T12.

In the comparison circuit 420B, a reference voltage Vlimit generated by the reference voltage generation circuit 410B is supplied to the non-inverting input terminal of the differential amplifier 422. Further, the detection voltage Vsense is supplied to the inverting input terminal of the differential amplifier 422 through the low pass filter 421.

In the method illustrated in FIG. 3, the detection voltage Vsense is a voltage obtained by subtracting a voltage drop of the resistor element R12 caused by the collector current Irp of the transistor T12 from the power supply voltage Vcc used as a reference. Further, the reference voltage generation circuit 410B generates the reference voltage Vlimit for comparing with the detection voltage Vsense based on the power supply voltage Vcc.

In the power amplifier module 1B, the voltage of the collector of the transistor T12 is supplied to the control circuit 20A as the detection voltage Vsense corresponding to the collector current Irp. Then, when the detection voltage Vsense is smaller than the reference voltage Vlimit, the collector current IeC of the transistor T21 is reduced. Thus, when the input power Pin becomes equal to or larger than the predetermined value, an increase in the collector current Icc of the transistor T11 is suppressed.

2. Operation of Power Amplifier Module 1B

Figure 4A:
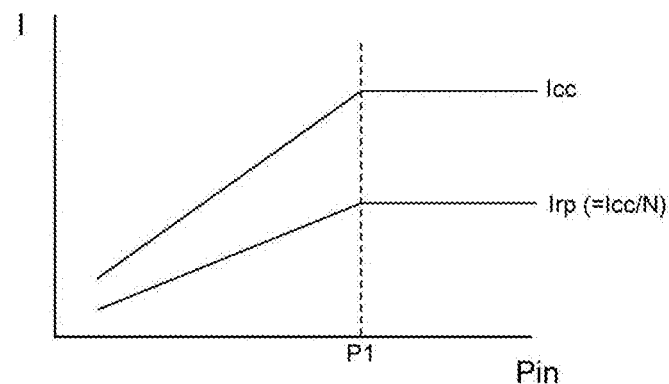
FIG. 4A is a schematic diagram illustrating an example of relationships between input power Pin and a collector current Icc and between input power Pin and a collector current Irp of the power amplifier module according to the second embodiment.
Figure 4B:
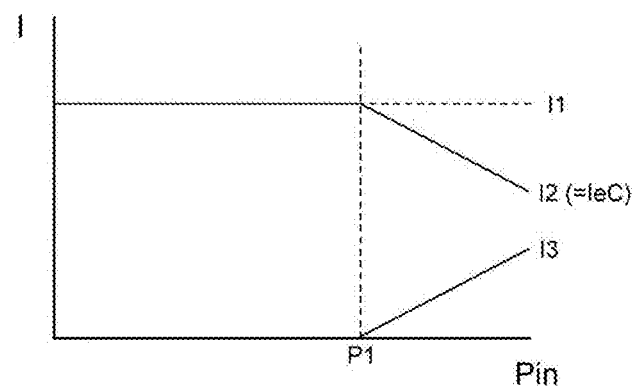
FIG. 4B is a schematic diagram illustrating an example of relationships between input power Pin and a current I1, between input power Pin and a current I2, and between input power Pin and a current I3 of the power amplifier module according to the second embodiment.
Figure 4B:
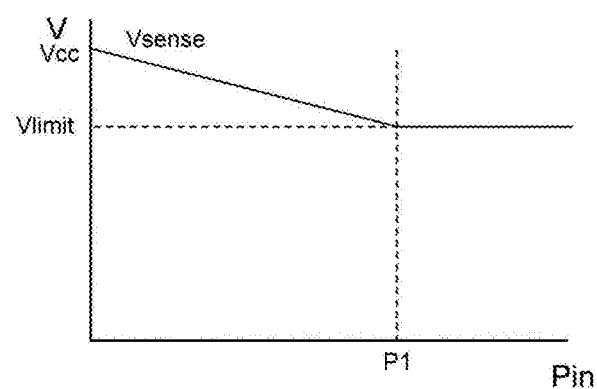

Referring to FIG. 4A to FIG. 4C, the operations of the power amplifier module 1B will be described.

FIG. 4A is a schematic diagram illustrating an example of relationships between the input power Pin which is the power of the RF signal (RFin) and the collector current Icc of the transistor T11 and between the input power Pin and the collector current Irp of the transistor T12. In FIG. 4A, the horizontal axis represents the input power Pin, and the vertical axis represents the current value.

FIG. 4B is a diagram illustrating an example of relationships between the input power Pin and the current I1 of the constant current source S41, between the input power Pin and the current I2 flowing through the N-channel MOSFET 42, and the between the input power Pin and current I3 flowing through the N-channel MOSFET 41. In FIG. 4B, a horizontal axis represents the input power Pin, and a vertical axis represents the current value.

FIG. 4C is a schematic diagram illustrating an example of a relationship between the input power Pin which is the power of the RF signal (RFin) and the detection voltage Vsense. In FIG. 4C, a horizontal axis represents the input power Pin, and a vertical axis represents the voltage value.

In a case that the input power Pin is smaller than a predetermined power value P1, since the output signal of the differential amplifier 422 is a negative voltage, the N-channel MOSFET 41 is OFF. Therefore, as illustrated in FIG. 4B, the current I1 of the constant current source S41 does not flow into the N-channel MOSFET 41, but flows into the N-channel MOSFET 42 entirely. That is, I1=I2. Then, by the current mirror connection of the N-channel MOSFETs 42 and 43 and the current mirror connection of the P-channel MOSFETs 44 and 45, a constant collector current IeC equal to the current I2 flows out of the P-channel MOSFET 45.

Then, the collector current IeC is supplied to the collector of the transistor T21. At this time, as illustrated in FIG. 4A, as the input power Pin increases, both the collector current Icc and the collector current Irp increase. Further, as illustrated in FIG. 4C, as the collector current Irp increases, the detection voltage Vsense decreases.

When the input power Pin rises to the predetermined value P1, as illustrated in FIG. 4C, the detection voltage Vsense becomes equal to the reference voltage Vlimit, and the output signal of the differential amplifier 422 switches from a negative voltage to a positive voltage (a voltage equal to or higher than the threshold voltage of the N-channel MOSFET 41). Thus, the N-channel MOSFET 41 is turned on, and the N-channel MOSFET 41 starts to extract the current I3 from the current I1 of the constant current source S41.

Further, as the input power Pin increases, as illustrated in FIG. 4B, the current I3 that the N-channel MOSFET 41 extracts from the constant current source S41 increases, and the current (=I1−I3) that flows into the N-channel MOSFET 42 decreases. Accordingly, the collector current IeC supplied from the P-channel MOSFET 45 to the transistor T21 also decreases. Then, both the bias current 'bias' supplied from the transistor T21 to the transistor T11 and the bias current Ibias2 supplied from the transistor T21 to the transistor T12 decrease. Therefore, as illustrated in FIG. 4A, even if the input power Pin rises, increases in the collector current Icc of the transistor T11 and the collector current Irp of the transistor T12 are suppressed (clamped). Then, as illustrated in FIG. 4C, a decrease in the detection voltage Vsense is also suppressed (clamped). As described above, when the input power Pin becomes equal to or larger than the predetermined value, an increase in the collector current Icc of the transistor T11 is suppressed.

Third Embodiment

Figure 5:
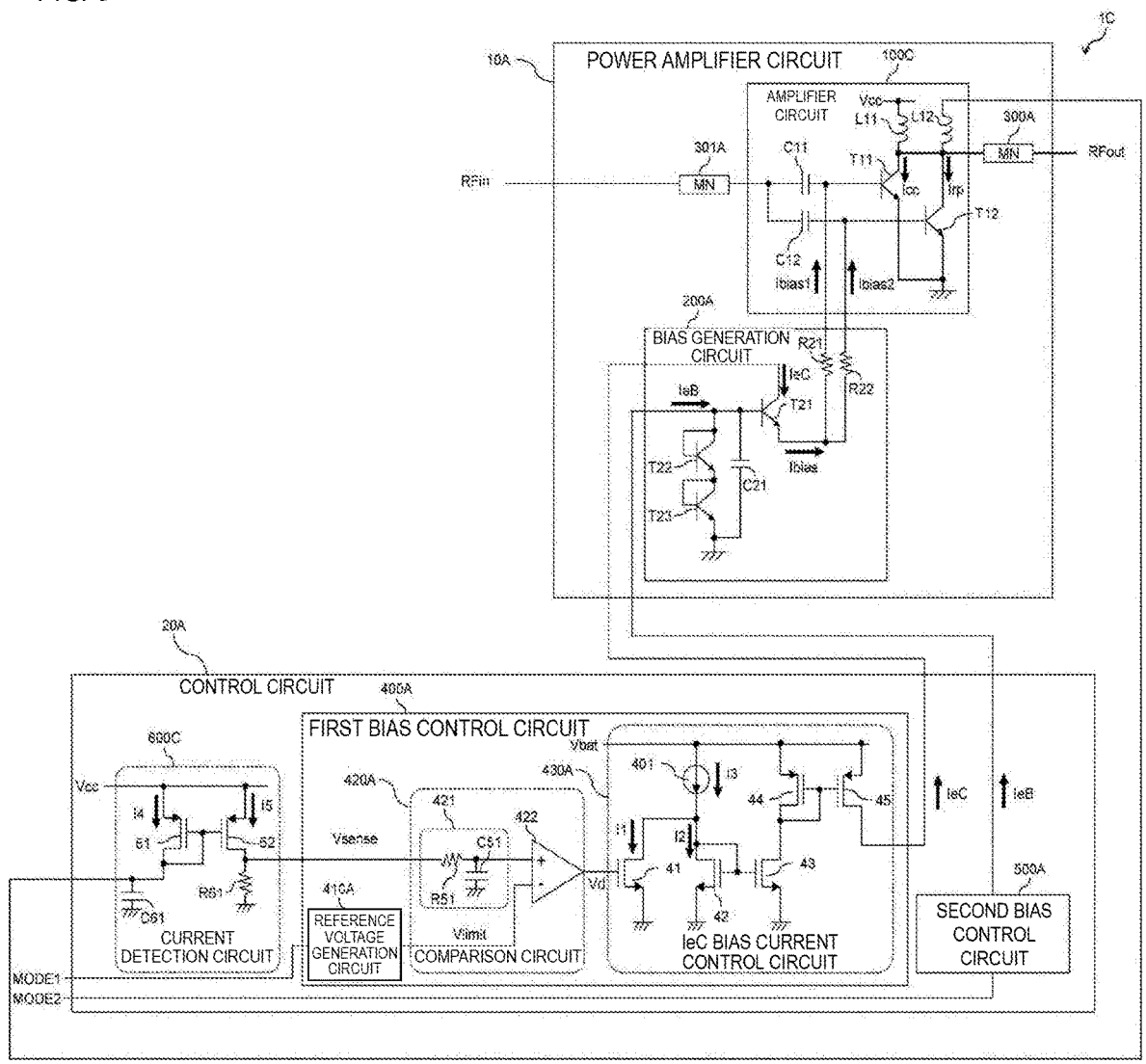
FIG. 5 is a diagram illustrating an example of a configuration of a power amplifier module according to a third embodiment of the present disclosure.

FIG. 5 is a diagram illustrating an example of a configuration of a power amplifier module 1C according to a third embodiment of the present disclosure. In the configuration of the power amplifier module 1C, the descriptions of the same configurations as that of the power amplifier module 1A will be omitted as appropriate.

As illustrated in FIG. 5, the power amplifier module 1C includes an amplifier circuit 100C in place of the amplifier circuit 100A. In addition, the control circuit 20A of the power amplifier module 1C further includes a current detection circuit 600C.

The amplifier circuit 100C does not include the resistor element R12, and includes an inductor L12. A first terminal of the inductor L12 is connected to the current detection circuit 600C included in the control circuit 20A. A second terminal of the inductor L12 is connected to the collector of the transistor T11 and the collector of the transistor T12. In the amplifier circuit 100C, the collector current Irp of the transistor T12 is directly monitored.

The current detection circuit 600C includes a P-channel MOSFET 61 (a fourth transistor), a P-channel MOSFET 62 (a fifth transistor), a resistor element R61, and a capacitor C61. The P-channel MOSFET 61 is diode-connected. A source of the P-channel MOSFET 61 is supplied with the power supply voltage Vcc. A drain of the P-channel MOSFET 61 is connected to a first terminal of the capacitor C61 and the first terminal of the inductor L12 included in the amplifier circuit 100C. A second terminal of the capacitor C61 is grounded. The P-channel MOSFET 61 is connected in current mirror connection with the P-channel MOSFET

62. A source of the P-channel MOSFET 62 is supplied with the power supply voltage Vcc. A drain of the P-channel MOSFET 62 is connected to a first terminal of the resistor element R61. A second terminal of the resistor element R61 is grounded. Note that the capacitor C61 and the inductor L12 constitute a low pass filter.

A current I4 flows through the P-channel MOSFET 61 by the power supply voltage Vcc. The current I4 is a current that the collector current Irp (detection current) flowing to the transistor T12 which is the replica element flows through the low pass filter consisting of the capacitor C61 and the inductor L12. In addition, a current I5 equal to the current I4 flowing through the P-channel MOSFET 61 flows through the P-channel MOSFET 62 due to the current mirror connection described above. Then, the resistor element R61 generates a voltage corresponding to the current I5 as the detection voltage Vsense corresponding to the collector current Irp of the transistor T12, and supplies the detection voltage Vsense to the comparison circuit 420A.

Then, similarly to the power amplifier module 1A, in a case that the detection voltage Vsense is larger than the reference voltage Vlimit, the collector current IeC of the transistor T21 is reduced. Thus, when the input power Pin becomes equal to or larger than the predetermined value, an increase in the collector current Icc of the transistor T11 is suppressed.

Specific Example of Reference Voltage Generation Circuit

Specific examples of the reference voltage generation circuit 410A will be described using FIG. 6 to FIG. 8, and the reference voltage generation circuit 410B will be described using FIG. 9 to FIG. 11.

Figure 6:
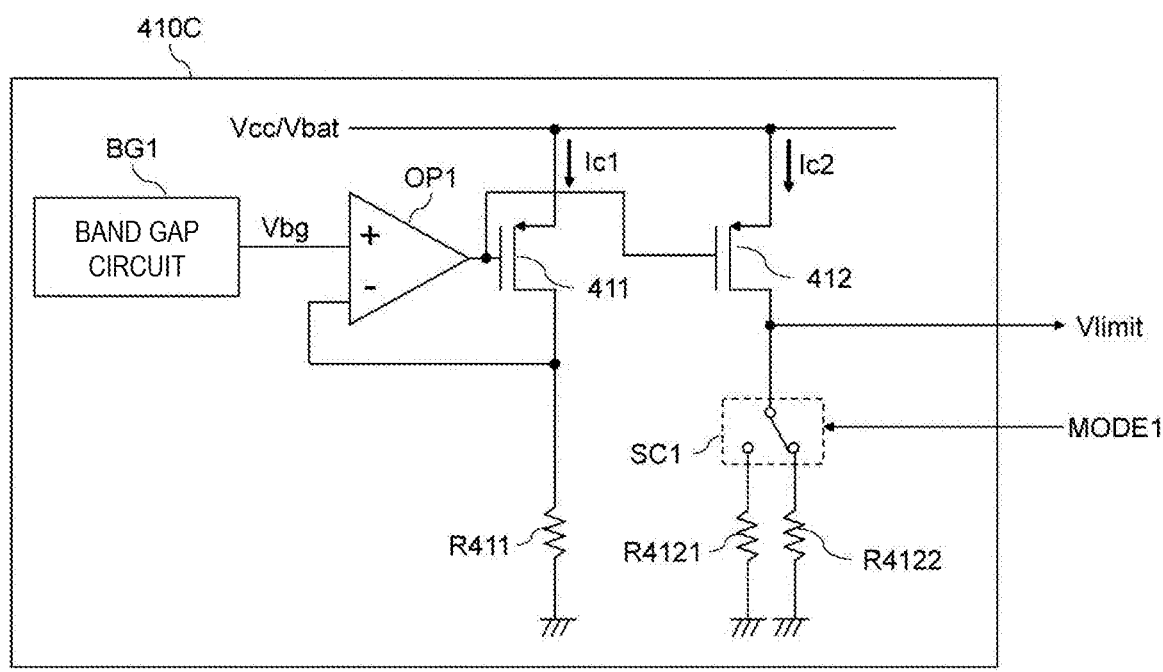
FIG. 6 is a diagram illustrating an example of a reference voltage generation circuit.

FIG. 6 is a diagram illustrating an example of a reference voltage generation circuit 410C. The reference voltage generation circuit 410C includes a band gap circuit BG1, an operational amplifier OP1, P-channel MOSFETs 411 and 412, resistor elements R411, R4121 and R4122, and a switch SC1. The reference voltage generation circuit 410C illustrated in FIG. 6 is a system in which the reference voltage Vlimit for each power mode is generated by the resistor elements R4121 and R4122.

The power supply voltage Vcc is supplied to a source of the P-channel MOSFET 411 and a source of the P-channel MOSFET 412. Note that the power supply voltage Vcc may be a voltage generated by a regulator, or may be a battery voltage. The band gap circuit BG1 generates a reference voltage (band gap voltage) Vbg and applies the reference voltage Vbg to a non-inverting input terminal of the operational amplifier OP1. The operational amplifier OP1 outputs the reference voltage Vbg to a gate of the P-channel MOSFET 411. A drain of the P-channel MOSFET 411 is connected to an inverting input terminal of the operational amplifier OP1 and a first terminal of the resistor element R411. A second terminal of the resistor element R411 is grounded. A drain of the P-channel MOSFET 412 is connected through a switch SC1 to a first terminal of the resistor element R4121 or a first terminal of the resistor element R4122. A second terminal of the resistor element R4121 and a second terminal of the resistor element R4122 are grounded. The gate of the P-channel MOSFET 411 is connected to a gate of the P-channel MOSFET 412. The control signal MODE1 is inputted to the switch SC1. When the control signal MODE1 indicates the high power mode, the switch SC1 connects the drain of the P-channel MOSFET 412 to the resistor element R4121. When the control signal MODE1 indicates the low power mode, the switch SC1 connects the drain of the P-channel MOSFET 412 to the resistor element R4122. The reference voltage Vlimit is outputted from the drain of the P-channel MOSFET 412.

It is assumed that the size of the P-channel MOSFET 411 is represented by "M411" or the like. At this time, Ic1=Vbg/R411 is satisfied. In addition, Ic2=Ic1×(M412/M411). Thus, in the high power mode, Vlimit=Ic2×R4121, and in the low power mode, Vlimit=Ic2×R4122.

Figure 7:
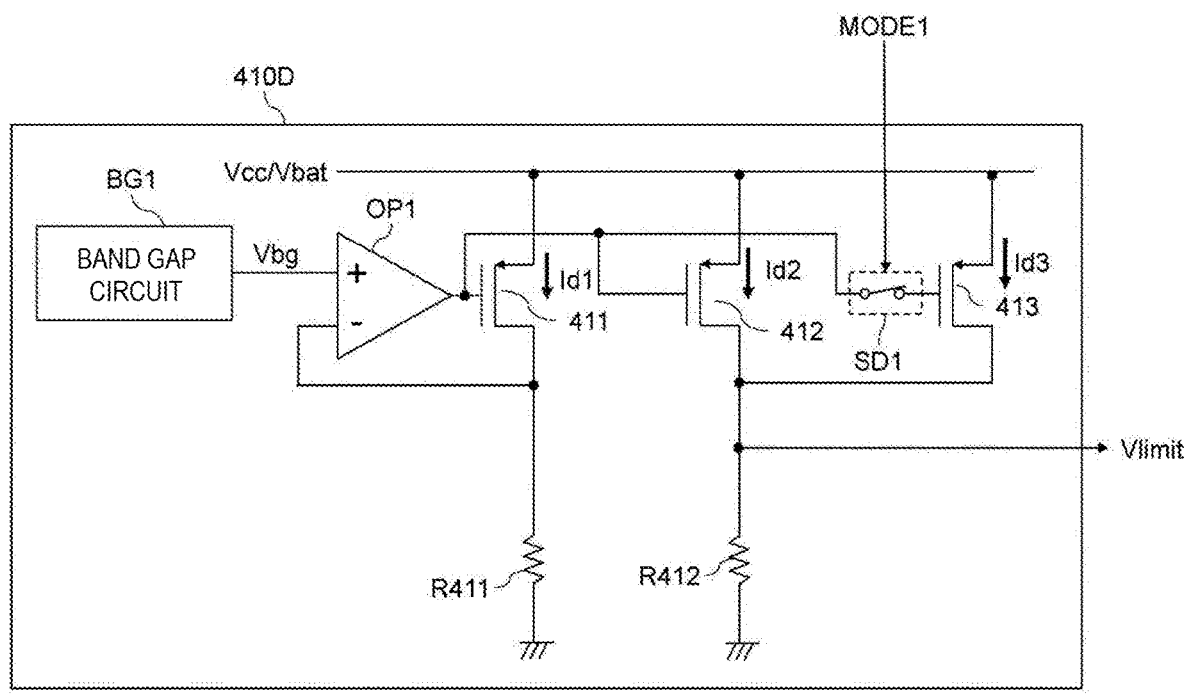
FIG. 7 is a diagram illustrating an example of a reference voltage generation circuit.

FIG. 7 is a diagram illustrating an example of a reference voltage generation circuit 410D. The reference voltage generation circuit 410D includes the band gap circuit BG1, the operational amplifier OP1, the P-channel MOSFETs 411 and 412, a P-channel MOSFET 413, the resistor element R411, a resistor element R412, and a switch SD1. The reference voltage generation circuit 410D illustrated in FIG. 7 is a system in which a current Id3 is added to a current Id2 by changing the size of the P-channel MOSFET (change in size by the switch SD1), and the reference voltage Vlimit for each power mode is generated.

The power supply voltage Vcc is supplied to each of the P-channel MOSFETs 411, 412 and 413. A current Id1 flows through the P-channel MOSFET 411, the current Id2 flows through the P-channel MOSFET 412, and the current Id3 flows through the P-channel MOSFET 413, respectively. A drain of the P-channel MOSFET 412 is connected to a first terminal of the resistor element R412. A source of the P-channel MOSFET 413 is supplied with the power supply voltage Vcc. A drain of the P-channel MOSFET 413 is connected to the drain of the P-channel MOSFET 412 and the first terminal of the resistor element R412. A gate of the P-channel MOSFET 411 is further connected to the switch SD1. The switch SD1 is connected to the gate of the P-channel MOSFET 411 and a gate of the P-channel MOSFET 413. The control signal MODE1 is inputted to the switch SD1. The switch SD1 is turned off when the control signal MODE1 indicates the high power mode, and is turned on when the control signal MODE1 indicates the low power mode.

Id1=Vbg/R411 is satisfied. In addition, Id2=Id1×(M412/M411) and Id3=Id1×(M413/M411). Therefore, in the high power mode, Vlimit=Id2×R412, and in the low power mode, Vlimit=(Id2+Id3)×R412. Further, the switch SC1 may be inversely operated by the detection voltage Vsense, that is, the switch SD1 may be turned on when the control signal MODE1 indicates the high power mode, and may be turned off when the control signal MODE1 indicates the low power mode.

Figure 8:
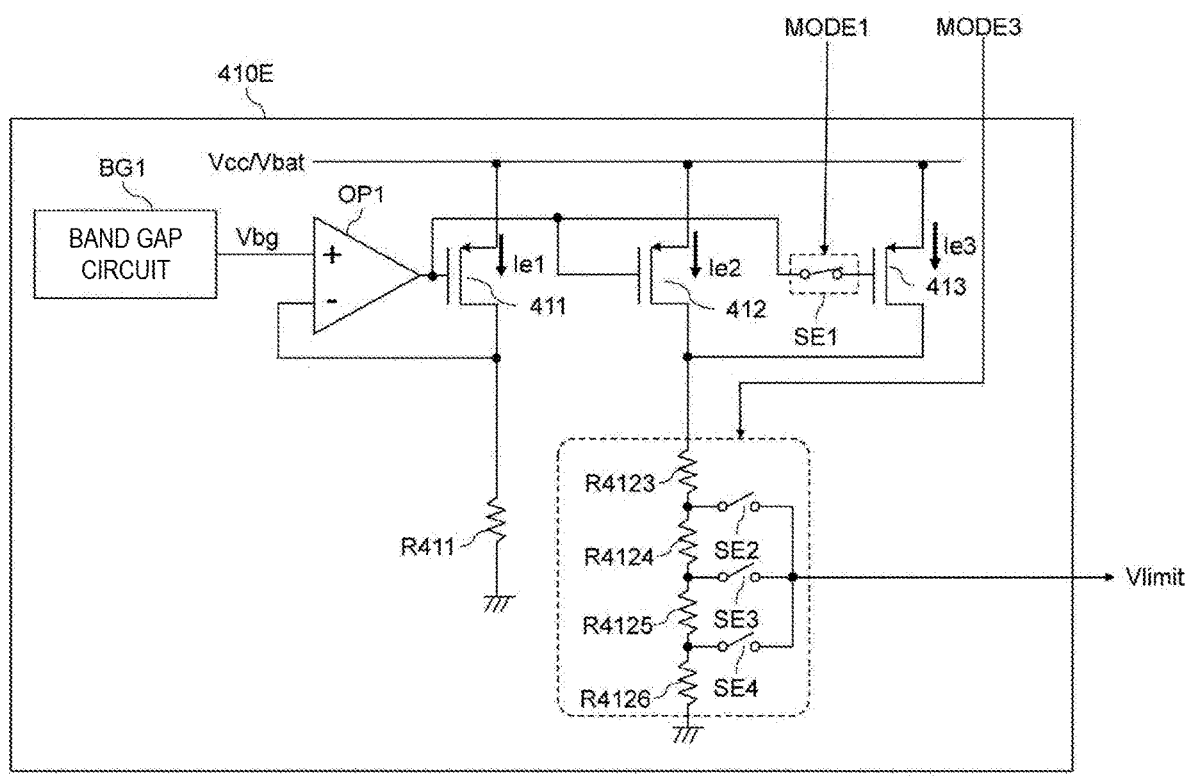
FIG. 8 is a diagram illustrating an example of a reference voltage generation circuit.

FIG. 8 is a diagram illustrating an example of a reference voltage generation circuit 410E. The reference voltage generation circuit 410E includes resistor elements R4123, R4124, R4125, and R4126 and switches SE2, SE3, and SE4, instead of the resistor element R412 of the reference voltage generation circuit 410D. A switch SE1 is supplied with the control signal MODE1, and the SE2, SE3, and SE4 are supplied with a control signal MODE3.

A second terminal of the resistor element R4123 is connected to a first terminal of the resistor element R4124 and a first terminal of the switch SE2, and a second terminal of the resistor element R4124 is connected to a first terminal of the resistor element R4125 and a first terminal of the switch SE3. A second terminal of the resistor element R4125 is connected to a first terminal of the resistor element R4126 and a first terminal of the switch SE4, and a second terminal of the resistor element R4126 is grounded. Respective second terminals of the switches SE2, SE3, and SE4 are connected to each other, and output the reference voltage Vlimit.

The switch SE1 may switch ON and OFF in response to the control signal MODE1 indicating the power mode of the power amplifier module 1A. For example, the switch SE1 is turned off when the control signal MODE1 indicates the high power mode, and is turned on when the control signal MODE1 indicates the low power mode.

The switches SE2, SE3, and SE 4 each may switch ON and OFF in response to the control signal MODE3 indicating a frequency band (band) of an RF signal. For example, in the switches SE2, SE3, and SE4, one of them is turned on according to the frequency band. Note that the switches SE2, SE3, and SE4 each may switch ON and OFF based on the information different from the frequency band of the RF signal. Further, the resistor elements R4123 to R4126 and the switches SE2 to SE4 may be increased in number, and the control signal MODE3 may be finely controlled using a digital signal.

$Ie1=Vbg/R411$ is satisfied. In addition, $Ie2=Ie1\times(M412/M411)$, and $Ie3=Ie1\times(M413/M411)$. Therefore, in the high power mode, $Vlimit=Ie2\times Re$, and in the low power mode, $Vlimit=(Ie2+Ie3)\times Re$. However, in a case that only the switch SE2 among the switches SE2, SE3, and SE4 is ON, $Re=R4124+R4125+R4126$, and in a case that only the switch SE3 is ON, $Re=R4125+R4126$, and in a case that only the switch SE4 is ON, $Re=R4126$.

Figure 9:
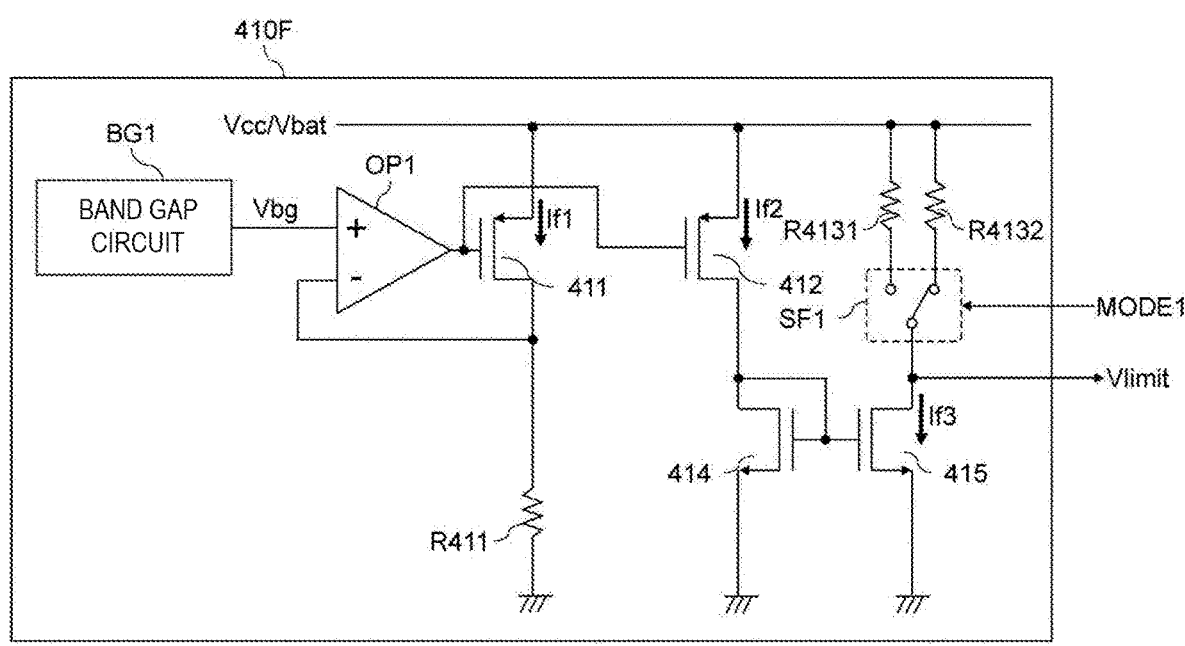
FIG. 9 is a diagram illustrating an example of a reference voltage generation circuit.

FIG. 9 is a diagram illustrating an example of a reference voltage generation circuit 410F. The reference voltage generation circuit 410F includes the band gap circuit BG1, the operational amplifier OP1, the P-channel MOSFETs 411 and 412, N-channel MOSFETs 414 and 415, resistor elements R4131 and R4132, and the switch SF1. The reference voltage generation circuit 410F illustrated in FIG. 9 is a system in which the reference voltage Vlimit for each power mode is generated by the resistor elements R4131 and R4132. Further, the reference voltage Vlimit is generated based on the power supply voltage Vcc.

The current If1 flows through the P-channel MOSFET 411, the current If2 flows through the P-channel MOSFET 412, and the current If3 flows through the N-channel MOSFET 415, respectively. The drain of the P-channel MOSFET 412 is connected to a drain of the N-channel MOSFET 414. A source of the N-channel MOSFET 414 is grounded. The N-channel MOSFET 414 is connected in current mirror connection with the N-channel MOSFET 415. A source of the N-channel MOSFET 415 is grounded. The power supply voltage Vcc is supplied to a first terminal of each of the resistor elements R4131 and R4132. The respective second terminals of the resistor elements R4131 and R4132 are connected to the switch SF1. The control signal MODE1 is inputted to a switch SF1. When the control signal MODE1 indicates the high power mode, the switch SF1 connects a drain of the N-channel MOSFET 415 to the resistor element R4131. When the control signal MODE1 indicates the low power mode, the switch SF1 connects the drain of the N-channel MOSFET 415 to the resistor element R4132. The reference voltage Vlimit is outputted from the drain of the N-channel MOSFET 415.

$If1=Vbg/R411$ is satisfied. In addition, $If2=If1\times(M412/M411)$, and $If3=If2$ (where, $M414=M415$). Therefore, in the high power mode, $Vlimit=Vcc-If3\times R4131$, and in the low power mode, $Vlimit=Vcc-If3\times R4132$.

Figure 10:
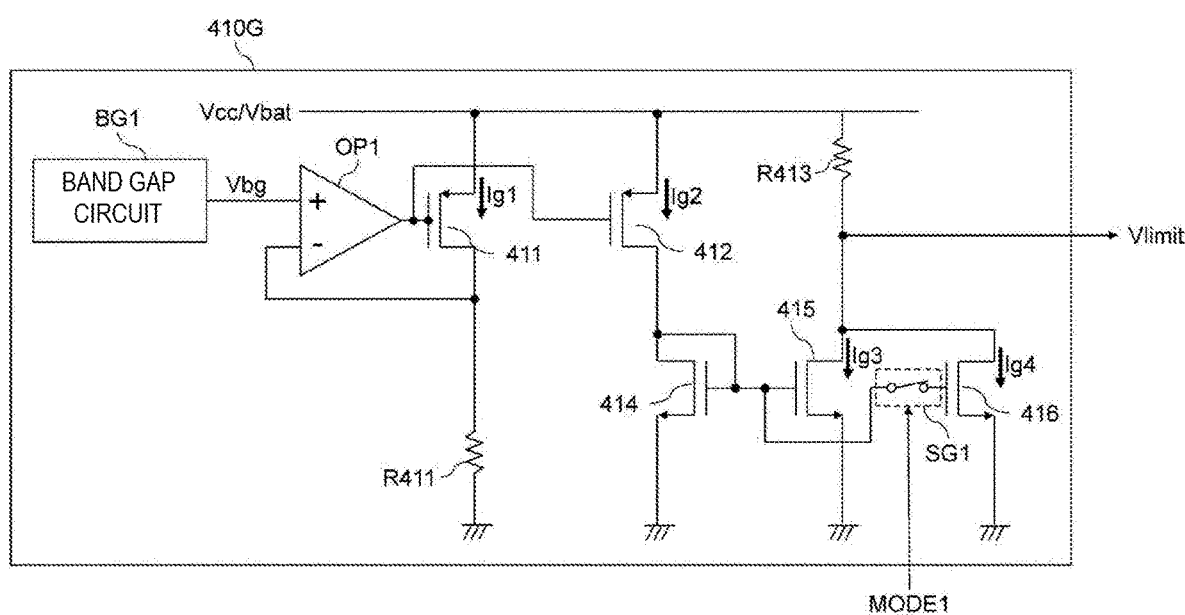
FIG. 10 is a diagram illustrating an example of a reference voltage generation circuit.

FIG. 10 is a diagram illustrating an example of a reference voltage generation circuit 410G. The reference voltage generation circuit 410G includes the band gap circuit BG1, the operational amplifier OP1, the P-channel MOSFETs 411 and 412, the N-channel MOSFETs 414 and 415, a N-channel MOSFET 416, the resistor element R411, a resistor element R413, and a switch SG1. The reference voltage generation circuit 410G illustrated in FIG. 10 is a system in which a current Ig4 is added to a current Ig3 by changing the size of the N-channel MOSFET (change in size by the switch SG1), and the reference voltage Vlimit for each power mode is generated. Further, the reference voltage Vlimit is generated based on the power supply voltage Vcc.

The power supply voltage Vcc is supplied to a first terminal of the resistor element R413. A second terminal of the resistor element R413 is connected to a drain of the N-channel MOSFET 415. The N-channel MOSFETs 415 and 416 are connected in current mirror connection. A drain of the N-channel MOSFET 416 is connected to the drain of the N-channel MOSFET 415, and a source of the N-channel MOSFET 416 is grounded. A gate of the N-channel MOSFET 415 and a gate of the N-channel MOSFET 416 are connected through the switch SG1. The current Ig3 flows through the N-channel MOSFET 415, and the current Ig4 flows through the N-channel MOSFET 416, respectively. In response to an input of the control signal MODE1, the switch SG1 switches ON and OFF. The reference voltage Vlimit is outputted from the drains of the N-channel MOSFETs 415 and 416.

$Ig1=Vbg/R411$ is satisfied. In addition, $Ig2=Ig1\times(M412/M411)$, and $Ig2=Ig3=Ig4$ (where $M414=M415=M416$). Therefore, in the high power mode, $Vlimit=Vcc-Ig3\times R413$, and in the low power mode, $Vlimit=Vcc-(Ig3+Ig4)\times R413$. Further, the switch SG1 may be inversely operated by the detection voltage Vsense, that is, the switch SG1 may be turned on when the control signal MODE1 indicates the high power mode, and may be turned off when the control signal MODE1 indicates the low power mode.

Figure 11:
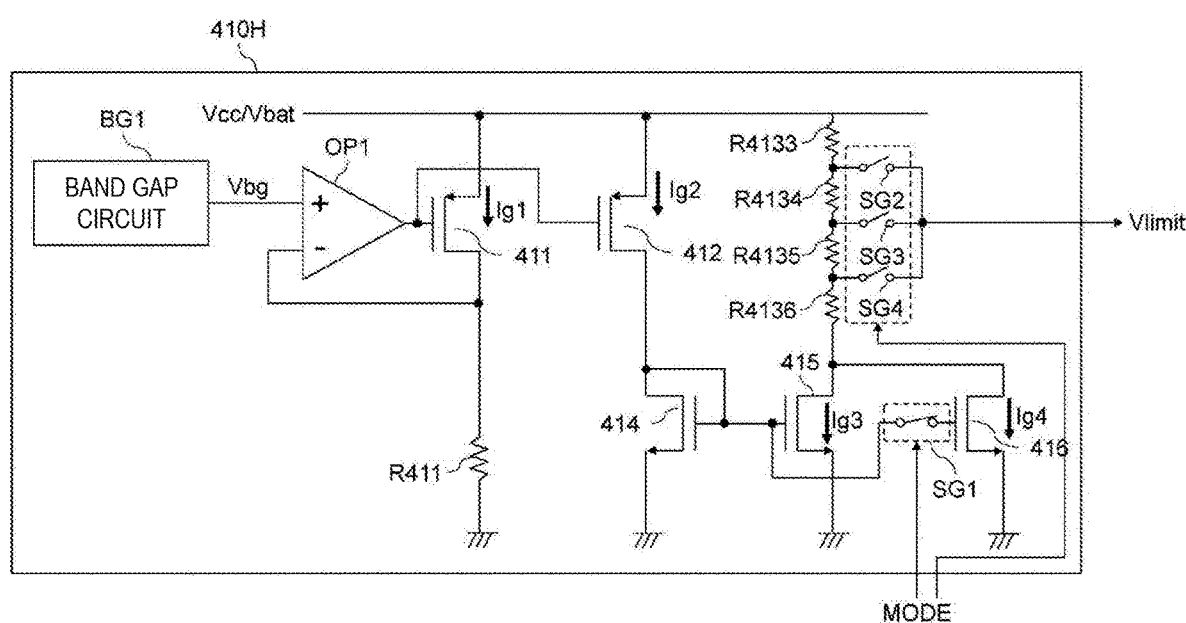
FIG. 11 is a diagram illustrating an example of a reference voltage generation circuit.

FIG. 11 is a diagram illustrating an example of a reference voltage generation circuit 410H. The reference voltage generation circuit 410H includes resistor elements R4133, R4134, R4135, and R4136 and switches SH2, SH3, and SH4 in place of the resistor element R413 of the reference voltage generation circuit 410G. A switch SH1 is supplied with the control signal MODE1, and the switches SH2, SH3, and SH4 are supplied with the control signal MODE3.

A second terminal of the resistor element R4133 is connected to a first terminal of the resistor element R4134 and a first terminal of the switch SH2, and a second terminal of the resistor element R4134 is connected to a first terminal of the resistor element R4135 and a first terminal of the switch SH3. A second terminal of the resistor element R4135 is connected to a first terminal of the resistor element R4136 and a first terminal of the switch SH4, and a second terminal of the resistor element R4136 is connected to the drain of the N-channel MOSFET 415 and the drain of the N-channel MOSFET 416. Respective second terminals of the switches SH2, SH3, and SH4 are connected to each other, and output the reference voltage Vlimit.

The switch SH1 may switch ON and OFF in response to the control signal MODE1 indicating the power mode of the power amplifier module 1B. For example, the switch SH1 is turned off when the control signal MODE1 indicates the high power mode, and is turned on when the control signal MODE2 indicates the low power mode.

The switches SH2, SH3, and SH4 may switch ON and OFF in response to the control signal MODE3 indicating the frequency band (band) of the RF signal. For example, any one of the switches SH2, SH3, and SH4 is turned on in accordance with the frequency band. Note that the switches SH2, SH3, and SH4 may switch ON and OFF based on the information different from the frequency band of the RF signal. Further, the resistor elements R4133 to R4136 and the switches SH2 to SH4 may be increased in number, and the control signal MODE3 may be finely controlled using a digital signal.

Ih1=Vbg/R411 is satisfied. In addition, Ih2=Ih1×(M412/M411), and Ih2=Ih3=Ih4 (where M414=M415=M416). Therefore, in the high power mode, Vlimit=Vcc−Ih3×Rh, and in the low power mode, Vlimit=Vcc−(Ih3+Ih4)×Rh. However, in a case that only the switch SH2 among the switches SH2, SH3, and SH4 is ON, Rh=R4133, and in a case that only the switch SH3 is ON, Rh=R4133+R4134, and in a case that only the switch SH4 is ON, Rh=R4133+R4134+R4135.

Variation

In the embodiments described above, the power amplifier circuit 10A includes the amplifier circuit of only a single stage. However, the power amplifier circuit 10A may be provided with a plurality of amplifier circuits such as a drive stage and a power stage. In this case, the control circuit 20A may obtain the detection voltage Vsense from any one of the plurality of amplifier circuits (e.g., the amplifier circuit of the power stage). Then, the control circuit 20A may supply a current to the collector of the bias supply transistor (third transistor) included in one amplifier circuit of the plurality of amplifier circuits (for example, the amplifier circuit of the drive stage) or the plurality of amplifier circuits (for example, the amplifier circuits of the drive stage and the power stage).

Further, the power amplifier module 1A may include a plurality of power amplifier circuits corresponding to a plurality of frequency bands (bands). Further, the control circuit 20A may obtain a detection voltage from each of the plurality of power amplifier circuits. Further, the control circuit 20A may include a switch for selectively supplying one of the plurality of detection voltages obtained from the plurality of power amplifier circuits to the comparison circuit 420A.

In the foregoing, the embodiments of the present disclosure have been described. The power amplifier module according to the embodiments of the present disclosure includes the first transistor that amplifies and outputs a radio frequency signal, the second transistor smaller in size than the first transistor and connected in parallel with the first transistor, the third transistor that supplies a bias current to the first and second transistors, the current detection circuit that detects a current flowing through the collector of the second transistor, and the bias control circuit that controls the bias current supplied from the third transistor to the first and second transistors by supplying a current corresponding to a detection result of the current detection circuit to the collector or the drain of the third transistor. In a case that a current flowing through the collector of the second transistor is larger than a predetermined threshold value, the bias control circuit reduces the current supplied to the collector or the drain of the third transistor. Thus, the current flowing through the collector of the second transistor is detected, and in a case that the current flowing through the collector of the second transistor is larger than the predetermined threshold value, the current supplied to the collector or the drain of the third transistor is reduced, and thus the bias current supplied to the first and second transistors can be directly controlled. Therefore, in the case that the input power is equal to or larger than a predetermined threshold value, it becomes possible to suppress the current flowing through the power amplifier circuit.

In addition, in the power amplifier module according to the embodiments of the present disclosure, the current detection circuit generates a detection voltage corresponding to the current flowing through the second transistor. Thus, it becomes possible to detect a current flowing through the first transistor.

In addition, in the power amplifier module according to the embodiments of the present disclosure, the current detection circuit includes a detection resistor for generating a detection voltage corresponding to the current flowing through the second transistor. Thus, it becomes possible to detect the current flowing through the first transistor.

In addition, in the power amplifier module according to the embodiments of the present disclosure, the detection resistor is connected in series with the second transistor. Thus, it becomes possible to detect the current flowing through the first transistor.

In addition, in the power amplifier module according to the embodiments of the present disclosure, the detection resistor is connected to the emitter of the second transistor. Thus, it becomes possible to detect the current flowing through the first transistor.

In addition, in the power amplifier module according to the embodiments of the present disclosure, the detection resistor is connected to the collector of the second transistor. Thus, it becomes possible to detect the current flowing through the first transistor.

In addition, in the power amplifier module according to the embodiments of the present disclosure, the detection circuit further includes the fourth transistor connected in series with the second transistor and the fifth transistor connected in current mirror connection with the fourth transistor, and the detection resistor is connected in series with the fifth transistor. Thus, it becomes possible to detect the current flowing through the first transistor.

In addition, in the power amplifier module according to the embodiments of the present disclosure, the bias control circuit includes the reference voltage generation circuit for generating a reference voltage of a predetermined level, the comparison circuit for outputting a voltage difference signal based on a difference between the detection voltage and the reference voltage, and the bias current control circuit for supplying a current corresponding to the voltage difference signal to the collector of the third transistor. Thus, it becomes possible to control the current flowing through the first transistor in accordance with the comparison between the detection voltage and the reference voltage.

In addition, in the power amplifier module according to the embodiments of the present disclosure, the comparison circuit includes the differential amplifier having the non-inverting input terminal to which the detection voltage is applied, the inverting input terminal to which the reference voltage is applied, and the output terminal for amplifying a difference between the detection voltage and the reference voltage at a predetermined ratio and outputting an amplified voltage difference as a voltage difference signal. Thus, it becomes possible to control the current flowing through the first transistor in accordance with the comparison between the detection voltage and the reference voltage.

In addition, in the power amplifier module according to the embodiments of the present disclosure, the comparison circuit includes the differential amplifier having the non-inverting input terminal to which the reference voltage is applied, the inverting input terminal to which the detection voltage is applied, and the output terminal for amplifying a difference between the reference voltage and the detection voltage at a predetermined ratio, and outputting an amplified voltage difference as a voltage difference signal. Thus, it becomes possible to control the current flowing through the first transistor in accordance with the comparison between the detection voltage and the reference voltage.

In addition, in the power amplifier module according to the embodiments of the present disclosure, the bias current control circuit reduces, based on the voltage difference signal outputted from the comparison circuit, the current supplied to the collector of the third transistor in a case that the current flowing through the second transistor is larger than a predetermined threshold value. Thus, in accordance with the comparison between the detection voltage and the reference voltage, in a case that the detection voltage is equal to or higher than a predetermined level, it becomes possible to reduce the current flowing through the first transistor.

In addition, in the power amplifier module according to the embodiments of the present disclosure, the bias current control circuit includes the constant current source for generating a constant current, the extraction circuit for extracting a current corresponding to the voltage difference signal from the constant current, and the current supply circuit for supplying, to the collector of the third transistor, a current obtained by subtracting the current extracted by the extraction circuit from the constant current generated by the constant current source. Thus, in accordance with the comparison between the detection voltage and the reference voltage, in a case that the detection voltage is equal to or higher than a predetermined level, it becomes possible to reduce the current flowing through the first transistor.

Note that, the embodiments are intended to facilitate understanding of the present disclosure and are not intended to limit the present disclosure. The present disclosure may be modified and improved without departing from the spirit and scope of the disclosure, and equivalents thereof may be included in the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier module comprising:
   a first transistor that amplifies and outputs a radio frequency signal;
   a second transistor smaller in size than the first transistor and connected in parallel with the first transistor;
   a third transistor that supplies a bias current to the first and second transistors;
   a current detection circuit that detects a current flowing through a collector of the second transistor; and
   a bias control circuit that controls the bias current supplied from the third transistor to the first and second transistors by supplying a current corresponding to a detection result of the current detection circuit to a collector or a drain of the third transistor, wherein
   in a case that a current flowing through the collector of the second transistor is larger than a predetermined threshold value, the bias control circuit reduces the current supplied to the collector or the drain of the third transistor.

2. The power amplifier module according to claim 1, wherein
   the current detection circuit generates a detection voltage corresponding to a current flowing through the collector of the second transistor.

3. The power amplifier module according to claim 2, wherein
   the current detection circuit includes a detection resistor for generating a detection voltage corresponding to the current flowing through the collector of the second transistor, and
   the detection resistor is connected in series with the second transistor.

4. The power amplifier module according to claim 3, wherein
   the detection resistor is connected to an emitter of the second transistor.

5. The power amplifier module according to claim 3, wherein
   the detection resistor is connected to the collector of the second transistor.

6. The power amplifier module according to claim 2, wherein
   the current detection circuit further includes:
     a fourth transistor connected in series with the second transistor;
     a fifth transistor connected in current mirror connection with the fourth transistor; and
     a detection resistor for generating a detection voltage corresponding to a current flowing through the collector of the second transistor, the detection resistor being connected in series with the fifth transistor.

7. The power amplifier module according to claim 2, wherein
   the bias control circuit includes:
     a reference voltage generation circuit for generating a reference voltage of a predetermined level;
     a comparison circuit for outputting a voltage difference signal based on a difference between the detection voltage and the reference voltage; and
     a bias current control circuit for supplying a current corresponding to the voltage difference signal to the collector of the third transistor.

8. The power amplifier module according to claim 3, wherein
   the bias control circuit includes:
     a reference voltage generation circuit for generating a reference voltage of a predetermined level;
     a comparison circuit for outputting a voltage difference signal based on a difference between the detection voltage and the reference voltage; and
     a bias current control circuit for supplying a current corresponding to the voltage difference signal to the collector of the third transistor.

9. The power amplifier module according to claim 6, wherein
   the bias control circuit includes:
     a reference voltage generation circuit for generating a reference voltage of a predetermined level;
     a comparison circuit for outputting a voltage difference signal based on a difference between the detection voltage and the reference voltage; and
     a bias current control circuit for supplying a current corresponding to the voltage difference signal to the collector of the third transistor.

10. The power amplifier module according to claim 7, wherein
    the comparison circuit includes a differential amplifier having:
      a non-inverting input terminal to which the detection voltage is applied;
      an inverting input terminal to which the reference voltage is applied; and an output terminal for amplifying a difference between the detection voltage and the reference voltage at a predetermined ratio and outputting an amplified voltage difference as the voltage difference signal.

11. The power amplifier module according to claim 7, wherein
the comparison circuit includes a differential amplifier having:
a non-inverting input terminal to which the reference voltage is applied;
an inverting input terminal to which the detection voltage is applied; and
an output terminal for amplifying a difference between the reference voltage and the detection voltage at a predetermined ratio and outputting an amplified voltage difference as the voltage difference signal.

12. The power amplifier module according to claim 7, wherein
in a case that the current flowing through the collector of the second transistor is larger than the predetermined threshold value, the bias current control circuit reduces, based on the voltage difference signal output from the comparison circuit, the current supplied to the collector of the third transistor.

13. The power amplifier module according to claim 10, wherein
in a case that the current flowing through the collector of the second transistor is larger than the predetermined threshold value, the bias current control circuit reduces, based on the voltage difference signal output from the comparison circuit, the current supplied to the collector of the third transistor.

14. The power amplifier module according to claim 11, wherein
in a case that the current flowing through the collector of the second transistor is larger than the predetermined threshold value, the bias current control circuit reduces, based on the voltage difference signal output from the comparison circuit, the current supplied to the collector of the third transistor.

15. The power amplifier module according to claim 7, wherein
the bias current control circuit includes:
a constant current source for generating a constant current;
an extraction circuit for extracting a current corresponding to the voltage difference signal from the constant current; and
a current supply circuit for supplying, to the collector of the third transistor, a current obtained by subtracting the current extracted by the extraction circuit from the constant current generated by the constant current source.

16. The power amplifier module according to claim 7, wherein
the bias control circuit is configured to set a set value for each band of the radio frequency signal or each mode with respect to the reference voltage of the predetermined level in the reference voltage generation circuit.

17. The power amplifier module according to claim 16, wherein
the bias control circuit is configured to switch a power mode of the power amplifier module between a high power mode and a low power mode.

18. The power amplifier module according to claim 7, wherein
the bias control circuit is configured to set, by a digital signal, a set value for each band of the radio frequency signal or each mode with respect to the reference voltage of the predetermined level in the reference voltage generation circuit.

19. The power amplifier module according to claim 18, wherein
the bias control circuit is configured to switch a power mode of the power amplifier module between a high power mode and a low power mode.

* * * * *

UNITED STATES PATENT AND TRADEMARK OFFICE
CERTIFICATE OF CORRECTION

PATENT NO. : 10,715,093 B2
APPLICATION NO. : 16/284002
DATED : July 14, 2020
INVENTOR(S) : Fuminori Morisawa et al.

Page 1 of 1

It is certified that error appears in the above-identified patent and that said Letters Patent is hereby corrected as shown below:

In the Specification

Column 3, Line 55, "current 'bias' generated" should read -- current Ibias1 generated --

Column 6, Line 20, "signal MODE'." should read -- signal MODE1. --

Column 7, Line 9, "(extraction circuit)" should read -- 41 (extraction circuit) --

Column 8, Line 36, "current (=I1-I3) that" should read -- current I2(=I1-I3) that --

Column 8, Line 39, "current 'bias' supplied" should read -- current Ibias1 supplied --

Column 10, Line 20, "current (=I1-I3) that" should read -- current I2(=I1-I3) that --

Column 10, Line 23, "current 'bias' supplied" should read -- current Ibias1 supplied --

Signed and Sealed this
Twelfth Day of January, 2021

Andrei Iancu
*Director of the United States Patent and Trademark Office*